United States Patent [19]
Liu

[11] Patent Number: 5,082,755
[45] Date of Patent: Jan. 21, 1992

[54] LIQUID CRYSTAL PROGRAMMABLE PHOTORESIST EXPOSURE METHOD FOR MAKING A SET OF MASKS

[75] Inventor: Yung S. Liu, Schenectady, N.Y.

[73] Assignee: General Electric Company, Schenectady, N.Y.

[21] Appl. No.: 629,084

[22] Filed: Dec. 17, 1990

Related U.S. Application Data

[63] Continuation of Ser. No. 415,693, Oct. 2, 1989, abandoned.

[51] Int. Cl.⁵ .................................................. G03F 9/00
[52] U.S. Cl. ........................................ 430/5; 430/394; 430/20; 430/22; 430/311
[58] Field of Search ................ 430/5, 20, 22, 394, 430/311

[56] References Cited

U.S. PATENT DOCUMENTS
4,610,940  9/1986  Araihara ............................ 430/22

FOREIGN PATENT DOCUMENTS
0212843  9/1988  Japan ................................ 430/20

Primary Examiner—Charles L. Bowers, Jr.
Assistant Examiner—J. Weddington
Attorney, Agent, or Firm—Marvin Snyder; James C. Davis, Jr.

[57] ABSTRACT

Photoresist layers are rapidly exposed in a pattern determined by electronically stored data by exposure of the photoresist through a high resolution liquid crystal shutter array.

10 Claims, 5 Drawing Sheets

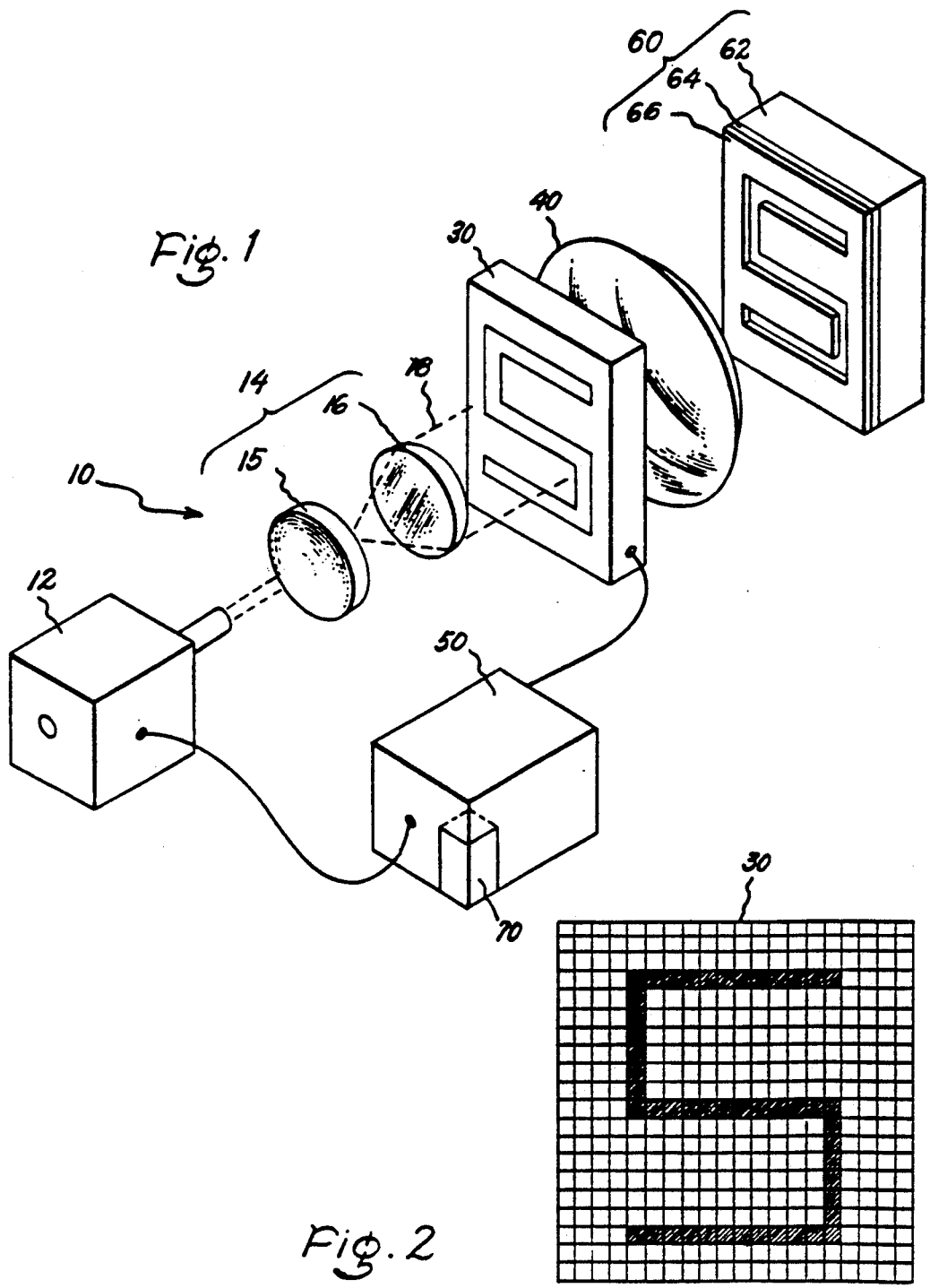

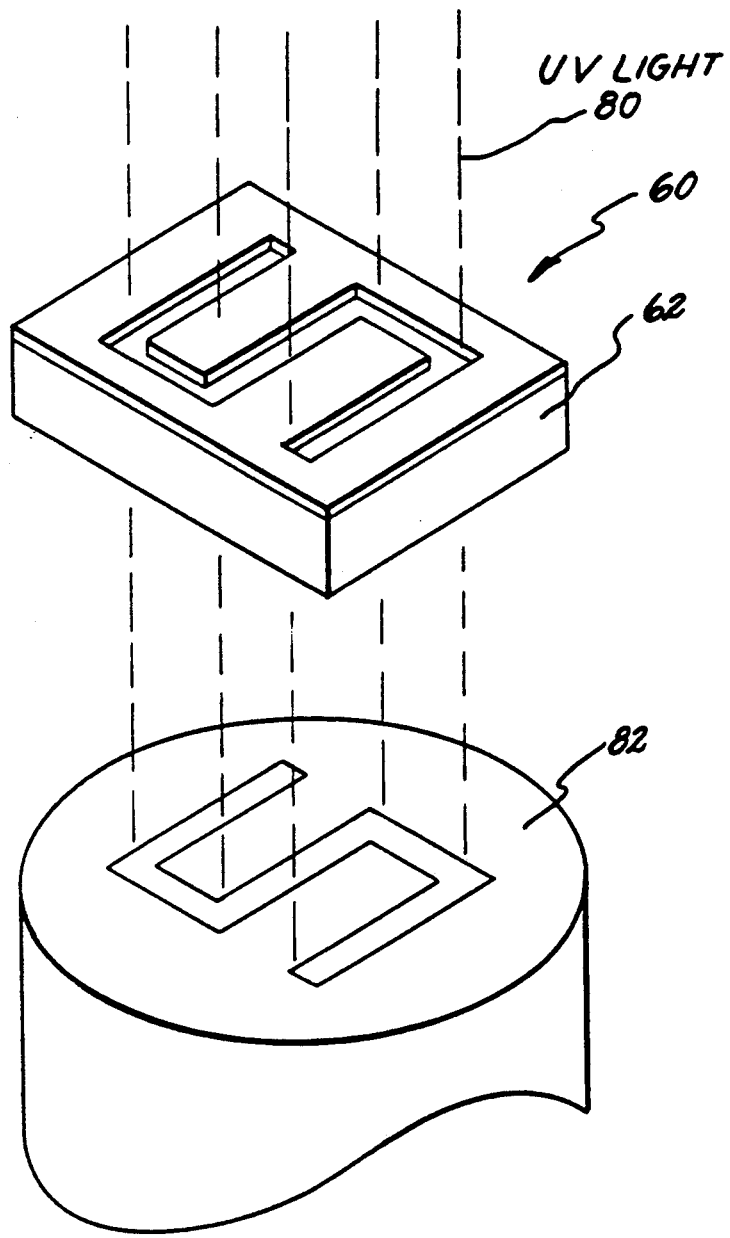

LIQUID CRYSTAL PROGRAMMABLE PHOTORESIST EXPOSURE METHOD FOR MAKING A SET OF MASKS

RELATED APPLICATIONS

This application is related to application Ser. No. 07/402,946 (RD-19,787), filed Sept. 5, 1989 and entitled, "Laser Shaping With an Area Patterning Mask" by R. M. Levinson, J. W. Rose and Y. S. Liu which is incorporated herein by reference.

BACKGROUND OF THE INVENTION

1. Field of the Invention

The present invention relates to the field of photolithographic mask making, and more particularly, to the fabrication of customized masks.

2. Background Information

Printed circuit boards are fabricated by providing an insulating substrate having a continuous layer of a metal such as copper foil bonded to one surface thereof and disposing a layer of photoresist over the metal foil and exposing the photoresist to light in the pattern which corresponds to the desired conductor pattern on the printed circuit board. This may result in cross-linking of the photoresist where it is exposed to light. This cross-linking reduces the solubility of the photoresist in appropriate solvents and the printed circuit board with the exposed resist is developed by immersion in a solvent for the photoresist material which differentially dissolves the unexposed and exposed portions of the photoresist. Following development of the photoresist, the printed circuit board is immersed in an etchant for the metallic foil of the printed circuit board which does not rapidly attack the photoresist with the result that the photoresist protects the metallic pattern where the photoresist remains and the remainder of the metal foil is etched away.

The exposure pattern applied to the photoresist is controlled by a photolithographic mask. Early in the photolithography art, such masks were hand fabricated by laying out dark strips of material such as plastic on a large matrix board (often 3 feet square or larger). The lengths and widths of these strips were in appropriate portion to the desired pattern on the printed circuit board. After the entire pattern was laid out, it was photographed and photographically reduced to the desired size for exposure of the photoresist on the printed circuit board blank. In this way, conductor patterns could be defined with sufficient accuracy and in a manageable manner. Each mask was time consuming and expensive to lay out. However, when amortized over many circuit boards, it was less expensive than hand wiring.

Early in the history of the semiconductor industry, a need developed for an ability to pattern layers on a semiconductor substrate in an accurate, detailed, repeatable manner with much finer resolution than is needed with printed circuit boards. Photoresist proved to be a solution to this problem. A layer of photoresist is disposed on the semiconductor wafer an exposed to a pattern of light which matches the desired pattern on the wafer either as a positive or negative, depending on whether a positive or negative photoresist is employed. The photoresist, upon exposure to light, changes its characteristics. With a negative photoresist, exposure to light results in cross-linking of molecules within the photoresist. In the case of a positive photoresist, the exposure to light breaks bonds within molecules of the photoresist. In either event, the photoresist layer is rendered differentially soluble in appropriate solvents. Following exposure, the photoresist is developed by immersion in an appropriate solvent which dissolves the portion of the photoresist layer which is not cross-linked without dissolving the portion of the photoresist layer which is cross-linked. The resulting pattern of photoresist matches the exposure pattern and is used to control the etching or other process steps to be carried out on the semiconductor wafer.

As the semiconductor industry matured, finer and finer patterns were needed with the result that mask production techniques became more refined, with step and repeat and laser drawing systems being developed to define a desired pattern in photoresist in a reasonable period of time with fine definition. Each mask is still expensive to design and fabricate. However, the mask which is used to expose the photoresist is used many times as part of the process of fabricating many identical devices. Thus, the cost of the mask is amortized over many devices which makes the cost of the mask acceptable.

As explained in the above-identified related incorporated-by-reference application, an area patterning mask can be used to control laser sculpturing of a corrective lens, other optical member for correcting vision or any other desired body. However, since the vision of each individual eye is essentially unique, when considered on a very detailed level, each mask can only be used once. Consequently, prior art mask fabrication techniques are unduly expensive and a less expensive, fast, accurate method of fabricating such masks is needed.

Liquid crystal displays have long been used to convert electronic information into human readable form. Early liquid crystal displays were employed as the display mechanism for electronic watches and similar large-character alpha-numeric displays. In such displays, rather coarse definition of the individual elements of the display was satisfactory because of the large size and low detail of the alpha-numeric characters.

As time has progressed, the resolution possible with liquid crystal displays has continually increased. Today, small television employ liquid crystal displays as their "picture tube". These TVs display a standard television picture and can change the entire image display in a short time which is generally less than 1/30th of a second. Thus, the liquid crystal display is a rapid transducer for converting electronic data into a pattern of light.

Liquid crystal displays are routinely available having cell sizes of about 100 microns × 100 microns. Liquid crystal displays with individual pixel or cells 50 microns on a side have been fabricated and displays with cell sizes as small as 25 microns on a side are feasible.

OBJECTS OF THE INVENTION

Accordingly, a primary object of the present invention is tc provide a rapid, low cost means of exposing a photoresist layer in a desired pattern.

Another object of the present invention is to employ a high resolution liquid crystal programmable exposure system to control the pattern of exposure of a layer of photoresist.

Another object of the present invention is to provide a rapid and inexpensive means for fabrication of a customized mask or a set of masks for laser shaping of a workpiece.

Still another object of the present invention is to provide a method for fabrication of customized masks by programming a high resolution liquid crystal display in accordance with data specifying a desired pattern of material removal.

SUMMARY OF THE INVENTION

The above and other objects which will become apparent from the specification as a whole, including the drawings, are accomplished in accordance with the present invention by employing a high resolution liquid crystal display as a shutter for controlling the pattern in which a layer of photoresist is exposed by a broad beam of light.

A programmable system for exposing the photoresist disposed on a substrate preferably includes means for supporting the substrate, a source of collimated light directed toward the substrate, a high resolution programmable liquid crystal shutter disposed between the source of collimated light and the substrate and an electronic control system for controlling the liquid crystal shutter. The control system receives a specification of the desired pattern of exposure for the photoresist and sets the liquid crystal shutter to a corresponding pattern of transmissive and opaque cells or pixels. After exposure, the photoresist is developed to provide the specified pattern.

In one particular preferred embodiment, a transparent substrate has a masking layer disposed on one major surface thereof and a photoresist layer disposed thereover. The photoresist is exposed using the liquid crystal exposure system and developed to leave the masking layer with a pattern of protected and unprotected regions as defined by the setting of the liquid crystal shutter during the exposure process. The substrate is then exposed to an etchant for the masking layer which removes the masking layer everywhere except where it is protected by the retained photoresist. Thereafter, the photoresist may be removed if desired. The substrate and masking layer can then serve as a mask for controlling the pattern in which actinic light reaches an object behind the masking layer. Alternatively, patterning of the "masking layer" may be the end objective of the process.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a stylized perspective illustration of a liquid crystal exposure system in accordance with the present invention;

FIG. 2 illustrates a matrix-addressable liquid crystal display set to display the character "S"

FIG. 4 illustrates the mask of FIG. 3C controlling exposure of a workpiece;

DETAILED DESCRIPTION

Figure 3A:
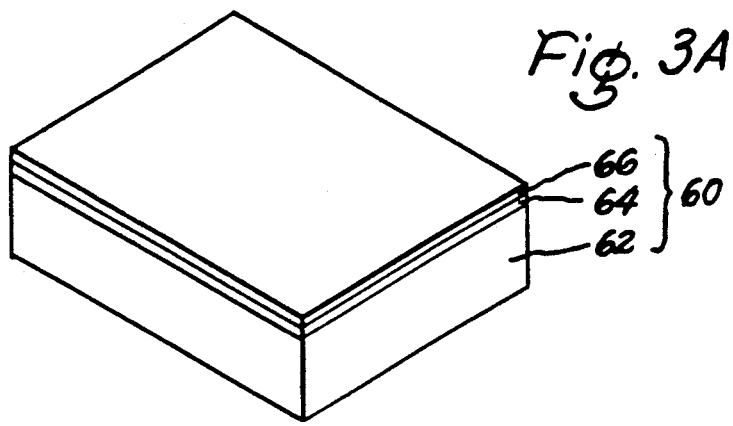
FIGS. 3A, 3B and 3C illustrate successive stages in the formation of a masking pattern on a transparent substrate.

In FIG. 1, a system 10 for exposing a photoresist layer is illustrated in perspective view. It is desired to expose a body 60 comprised of a transparent substrate 62, a masking layer 64 disposed on the substrate and a photoresist layer 66 disposed over the masking layer to actinic radiation to pattern the photoresist to control etching of the masking layer to create a mask 60 having a desired pattern of transparent and opaque regions. This is done by the system 10 which comprises a laser or other light source 12 whose beam may be expanded and is rendered into collimated light by a collimator 14 comprised of optical elements 15 and 16. The resulting collimated beam of light 18 is directed at a high resolution, matrix addressable liquid crystal exposure element or shutter 30 which blocks or transmits light in each liquid crystal cell or pixel in accordance with the setting of the individual liquid crystal cell as controlled by an electronic control system 50. The electronic control system 50 includes an interface subsystem 70 for connecting it to other digital instruments (not shown) which provide data for specifying the desired exposure pattern for the mask. The light pattern which passes through the liquid crystal shutter 30 and is transferred through an optical element 40 impinges on the photoresist layer 66 and exposes it to create a latent pattern in the photoresist which corresponds to the pattern of transmission by the liquid crystal shutter 30.

The optical element 40 may be omitted where the photoresist layer 66 is disposed in contact with the liquid crystal shutter element 30.

Where higher resolution (finer detail) exposure of a photoresist is desired than is provided by direct contact between the liquid crystal shutter 30 and the photoresist layer 66, the optical element 40 preferably provides an image of the liquid crystal shutter element 30 which is reduced in size and focused on the photoresist layer 66. In this manner, by use of a 2 to 1 reduction, a liquid crystal shutter 30 which is 2 inches×2 inches and has individual pixel which are 100 microns square, can expose a 1 inch square segment of a photoresist layer with a resolution having pixel elements which are 50 microns square. In this manner, almost any desired reduction and corresponding increase in resolution may be provided through use of a sufficiently large liquid crystal shutter 30 and appropriate optics 40.

Figure 3B:
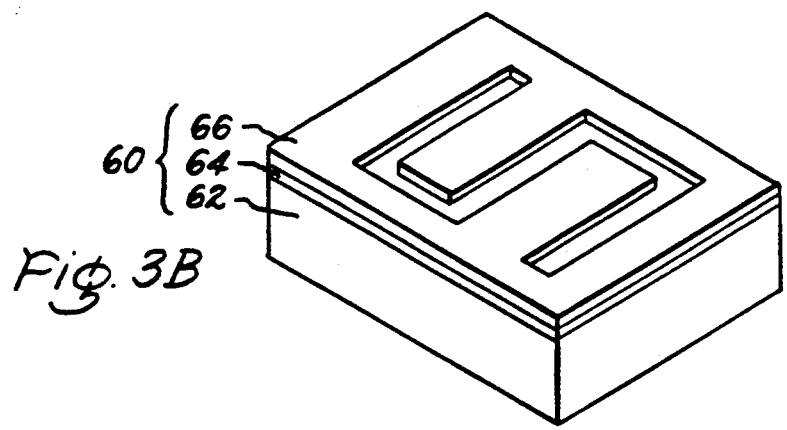
Figure 3C:
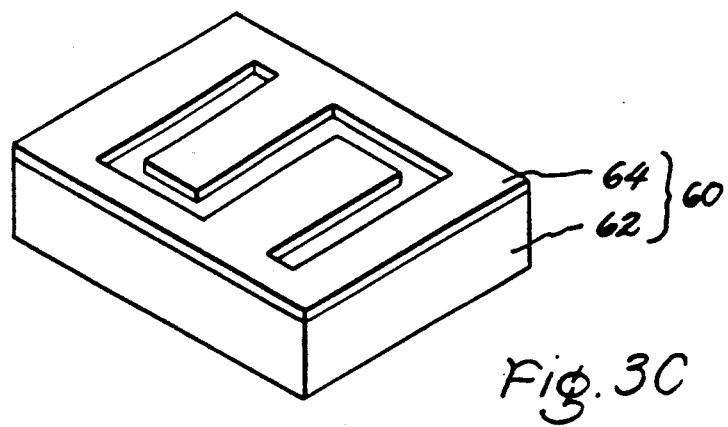

FIG. 2 illustrates the letter "S" displayed on a liquid crystal shutter having a rectangular matrix of square cells as its display pattern. The letter "S" in this illustration is rather coarsely defined because of a relatively small number of cells illustrated within the figure. With available liquid crystal display technology, the display area can be 2 inches×2 inches or larger with cell or pixel sizes of 50 microns square or smaller. In such a liquid crystal display element or shutter, extremely high resolution definition of a displayed pattern may be provided. Such displays provide the ability to individually control the state of every pixel in the display. Consequently, any desired pattern of transmissive and opaque pixels may be provided.

Where a positive photoresist is employed, the layer of photoresist becomes bond-broken where the light strikes it, thereby rendering it largely soluble in appropriate solvents. The mask 60 is then immersed in or otherwise exposed to a solvent which dissolves those portions of the photoresist layer which are not cross-linked and leaves intact those portions of the photoresist layer which are cross-linked. Thereafter, the mask 60 is exposed to an etchant for the masking layer 60 which either does not attack the remaining photoresist or attacks it very slowly whereby the masking layer 64 may be removed every place where it is not protected by the retained portions of the photoresist 66. This is illustrated in FIG. 3 where FIG. 3A illustrates the mask 60 prior to exposure of the photoresist, FIG. 3B illustrates the mask 60 after exposure of and development of the photoresist layer 66 and FIG. 3C illustrates the mask after the masking layer 64 has been etched in the pattern determined by the retained photoresist and the retained photoresist has been removed by an appropriate solvent in a manner well known in the semiconductor art to leave an opaque masking pattern on the transparent substrate 62.

A photoresist exposure system in accordance with the invention is particularly suited for converting electronic data specifying an exposure pattern for creating a mask for laser ablation shaping of a lens, lenticule or cornea into an actual mask pattern because of its high resolution and rapid setting.

FIG. 4 illustrates the mask 60 being used to control the pattern in which a beam 80 of ultraviolet light strikes a workpiece 82 in order to shape the workpiece by ablation. Where the beam of ablative light is in the ultraviolet portion of the spectrum, such as at 193 nm, the substrate 62 of the mask 60 must be transmissive to ultraviolet light. Consequently, for such applications, a substrate such as quartz is preferred. A laser is a preferred source of UV light, but a UV lamp (incoherent) may be used.

Figure 5:
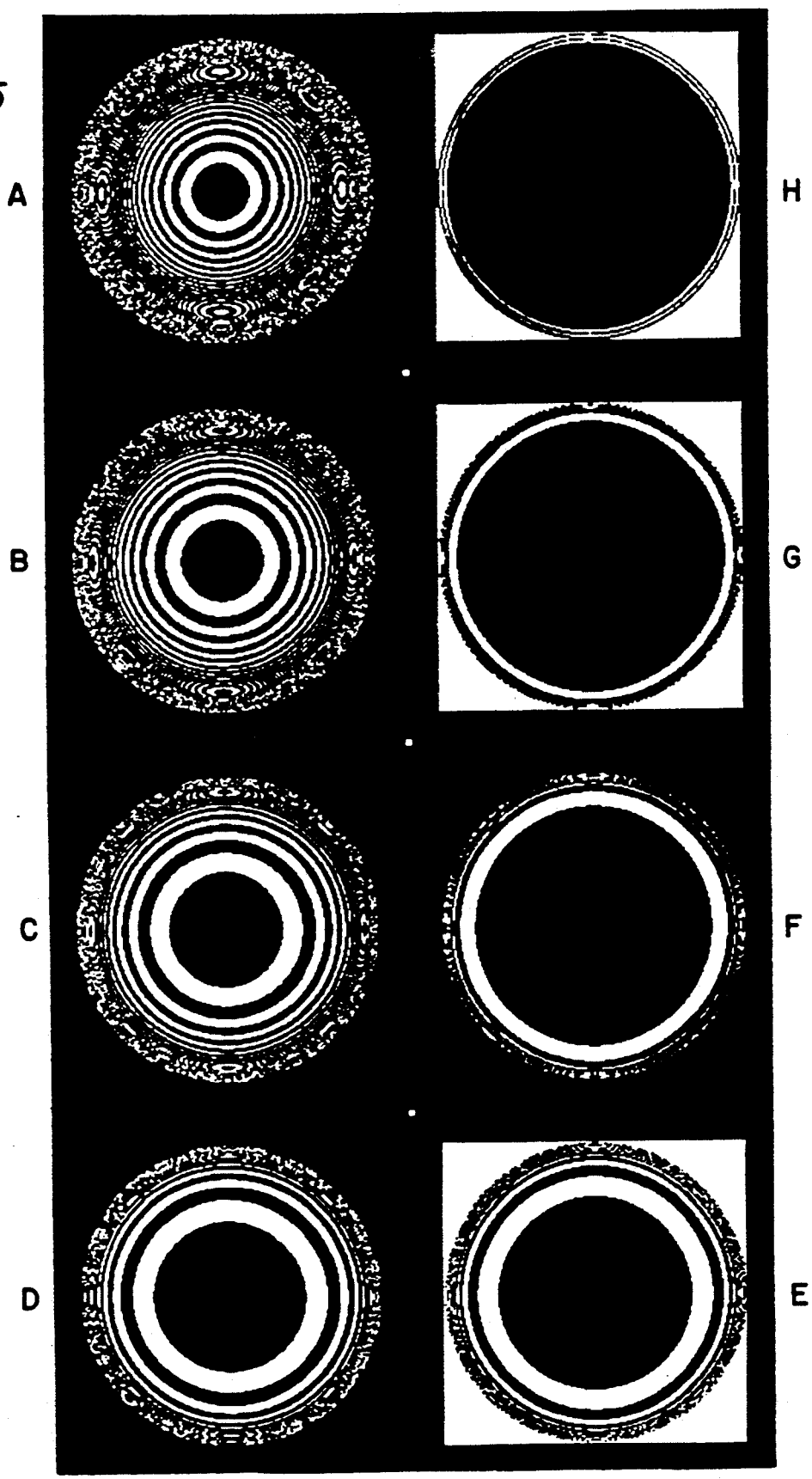
FIG. 5 illustrates a mask pattern which can be produced by this invention.

FIG. 5 is presented to illustrate the type of mask definition which may be provided using the liquid crystal exposure system of the present invention. FIG. 5 is taken from the above-identified, incorporated-by-reference application and illustrates an enlarged set of eight weighted masks (or mask patterns) which are effective for changing a flat surface of a block of laser ablatable material into a curved surface. These masks have weights of 1, 2, 4, 8, 16, 32, 64 and 128 (A-H, respectively. That is, to provide a smoothly varying surface contour, the mask of weight 1 is used to control the ablative removal of a unit thickness of material, the mask of weight 2 is used to control the ablative removal of twice the unit thickness of material, the mask of weight 4 is used to control the removal of four times the unit thickness of material, and so forth. For equal energy laser pulses, these masks have 1, 2, 4, 8, 16, 32, 64 and 128 pulses, respectively, directed through them while they are disposed in proper alignment with the block of material whose upper surface is to be converted to a curved surface. For a laser energy which is selected to remove an appropriate depth of material for each pulse, this set of masks produces curved surface which is a portion of a spherical surface. For ablative exposure, each of the circular mask patterns may preferably be reduced to about 10 mm in diameter.

It will be noted that for a two-dimensional, matrix-addressable liquid crystal display, a switching element which is commonly in the form of a thin film transistor (TFT) is used to control the ON/OFF state of each pixel element. One TFT switching element usually is fabricated electrically in series with each individual liquid crystal display cell or element. Physically, these non-transmitting switching TFT's occupy a portion of the pixel area. In a high resolution liquid crystal display, as the pixel size decreases, the percentage of non-transmitting surface area (that portion of the area occupied by the TFT's) increases relative to the total pixel dimensions. When a high resolution liquid crystal display is used as a programmable exposure system, it is desirable to minimize the non-transmitting surface area occupied by the TFT switching element.

Figure 6:
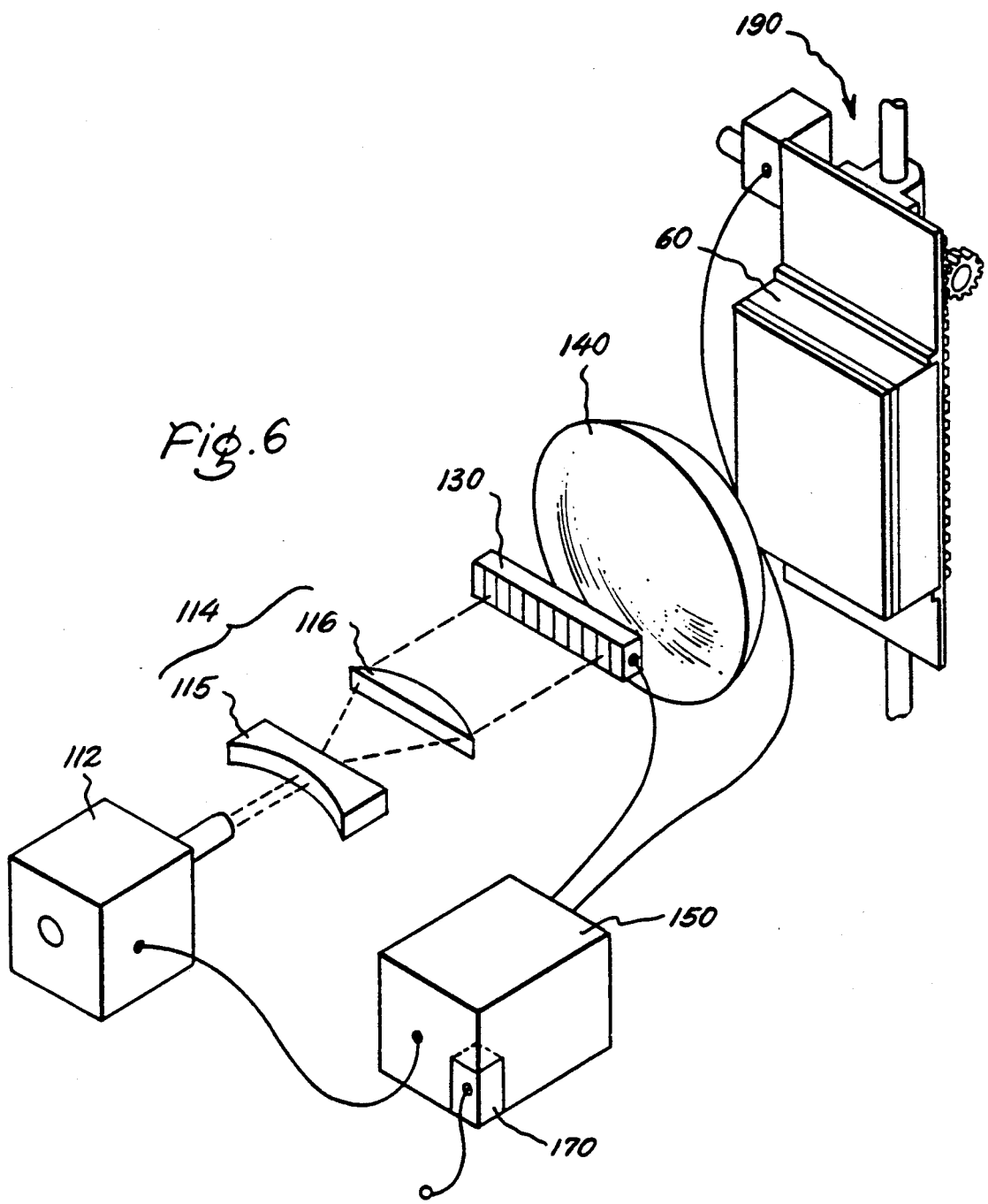
FIG. 6 illustrates a liquid crystal programmable exposure system including a linear array of liquid crystal elements.

One way to accomplish this is to use a linear, one-dimensional, liquid crystal array as the liquid crystal shutter with the TFT transistors disposed outside the pixel area such that the resulting non-transmitting surface area does not reside within the display area. An example of such a system is illustrated in FIG. 6 where a laser or other light source 112 provides a light beam which is expanded in the horizontal dimension by a collimator 114 comprised of lenses 115 and 116 into a parallel beam which strikes a linear liquid crystal array shutter 130 whose image is focused by an optical element onto a mask 60 which is translated in the vertical direction by a mechanism 190 in order to sequentially expose successive lines of the mask. Translation mechanism can be any appropriate system. One example is an X-Y table which has the advantage of enabling fine alignment in the horizontal direction as well as translation in the vertical direction. The vertical translation of the mask 60 may be continuous or stepped. The TFTs in the liquid crystal shutter 130 are preferably positioned above or below the display cells so that the display cells are disposed as close together as possible horizontally. In this system, the electronics 150 convert the mask specification data received by the interface portion 170 into separate control patterns for separate lines of the mask and sequentially activates the liquid crystal shutter 130 with these lines of data in order to properly expose the mask. The light shutter 130 is preferably rendered opaque every place during translation of the mask from one line to the next prior to imposing the pattern for the next line when it is properly aligned with the liquid crystal shutter. If opaque spaces between adjacent cells interfere with proper exposure of large transmissive areas, each mask line can be exposed twice with the liquid crystal shutter offset slightly in the horizontal direction for the two exposures.

While a particular programmable system for exposing a photoresist layer which uses a liquid crystal shutter has been illustrated, it will be recognized that liquid crystal displays may be used as masks in many other ways and that such techniques are within the scope of the present invention. The liquid crystal display may itself be used as a mask for controlling ablation of a workpiece if the display is sufficiently transmissive to actinic radiation in one state and sufficiently non-transmissive in another state.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for making a set of masks which includes a plurality of isolated mask regions intended for sequential exposure of a surface of a block of material, said method comprising:

(a) providing a mask blank comprising a transmissive substrate, an opaque coating and a layer of photoresist over said coating;
(b) aligning said mask blank with respect to a liquid crystal shutter array with one of said plurality of mask regions aligned with said liquid crystal shutter array;
(c) rendering said liquid crystal shutter array optically transmissive in a pattern corresponding to the desired pattern for the particular mask region;
(d) exposing said photoresist layer to activating illumination through said liquid crystal shutter array;
(e) repeating steps b-d for each of the rest of said plurality of mask regions, with the desired pattern being different for at least some of said mask regions; and
(f) developing said photoresist and removing unprotected portions of said opaque coating from said substrate to provide said set of masks comprising a plurality of isolated mask regions.

2. The method recited in claim 1 wherein said photoresist is a positive photoresist and said liquid crystal display is rendered transmissive in the pattern in which transmissive areas are desired in said final mask.

3. The method recited in claim 1 wherein said photoresist is a negative photoresist and said liquid crystal display is rendered transmissive in the complement of the pattern in which transmissive areas are desired in said mask.

4. The method recited in claim 1 wherein:
said substrate is transmissive to ultraviolet light.

5. The method recited in claim 1 wherein:
said substrate is transmissive to ultraviolet light having a wavelength in the vicinity of 193 nanometers.

6. A method of making a mask comprising:
(a) providing a mask blank comprising a transmissive substrate, an opaque coating and a layer of photoresist over said coating;
(b) aligning said mask blank with respect to a liquid crystal shutter array consisting of a single line of shutter cells;
(c) rendering said liquid crystal shutter array optically transmissive in a pattern corresponding to the desired mask pattern for one line of said mask;
(d) exposing said photoresist layer to activating illumination through said liquid crystal shutter array;
(e) shifting said mask blank relative to said liquid crystal shutter array to align the next line of said mask blank with said liquid crystal shutter array in a manner to produce a continuous mask pattern;
(f) rendering said liquid crystal shutter array optically transmissive in a pattern corresponding to the desired mask pattern for the aligned line of said mask blank;
(g) exposing said photoresist layer to activating illumination through said liquid crystal shutter array;
(h) repeating steps e-g until the mask blank has been exposed in a manner to produce the desired mask; and
(i) developing said photoresist and removing unprotected portions of said opaque coating from said substrate.

7. The method recited in claim 6 wherein said photoresist is a positive photoresist and said liquid crystal display is rendered transmissive in the pattern in which transmissive areas are desired in said final mask.

8. The method recited in claim 6 wherein said photoresist is a negative photoresist and said liquid crystal display is rendered transmissive in the complement of the pattern in which transmissive areas are desired in said mask.

9. The method recited in claim 6 wherein:
said substrate is transmissive to ultraviolet light.

10. The method recited in claim 6 wherein:
said substrate is transmissive to ultraviolet light having a wavelength in the vicinity of 193 nanometers.

* * * * *